United States Patent
Farooq et al.

(10) Patent No.: US 8,546,961 B2
(45) Date of Patent: Oct. 1, 2013

(54) ALIGNMENT MARKS TO ENABLE 3D INTEGRATION

(75) Inventors: Mukta G. Farooq, Hopewell Junction, NY (US); Troy L. Graves-Abe, Wappingers Falls, NY (US); Robert Hannon, Wappingers Falls, NY (US); Emily R. Kinser, Poughkeepsie, NY (US); William F. Landers, Wappingers Falls, NY (US); Kevin S. Petrarca, Newburgh, NY (US); Richard P. Volant, New Fairfield, CT (US); Kevin R. Winstel, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 20 days.

(21) Appl. No.: 12/987,202

(22) Filed: Jan. 10, 2011

(65) Prior Publication Data
US 2012/0175789 A1 Jul. 12, 2012

(51) Int. Cl.
*H01L 23/544* (2006.01)
*H01L 21/02* (2006.01)

(52) U.S. Cl.
USPC ............ 257/797; 257/E23.179; 257/E21.002; 438/459; 438/462

(58) Field of Classification Search
USPC .......... 257/797, E23.179, E21.002; 438/459, 438/462
See application file for complete search history.

(56) References Cited

U.S. PATENT DOCUMENTS

| | | | |
|---|---|---|---|
| 5,627,106 A | 5/1997 | Hsu | |
| 5,915,167 A | 6/1999 | Leedy | |
| 6,087,719 A * | 7/2000 | Tsunashima | 257/686 |
| 6,133,640 A | 10/2000 | Leedy | |
| 6,208,545 B1 | 3/2001 | Leedy | |
| 6,372,600 B1 | 4/2002 | Desko et al. | |
| 6,551,857 B2 | 4/2003 | Leedy | |
| 6,563,224 B2 | 5/2003 | Leedy | |
| 6,590,258 B2 | 7/2003 | Divakaruni et al. | |
| 6,632,706 B1 | 10/2003 | Leedy | |
| 6,709,949 B2 | 3/2004 | Hubner | |
| 6,841,469 B2 * | 1/2005 | Sawada et al. | 438/629 |
| 7,122,912 B2 * | 10/2006 | Matsui | 257/797 |
| 7,138,295 B2 | 11/2006 | Leedy | |
| 7,193,239 B2 | 3/2007 | Leedy | |

(Continued)

FOREIGN PATENT DOCUMENTS

| CN | 1525485 | 4/1998 |
|---|---|---|
| CN | 101188235 | 4/1998 |

(Continued)

OTHER PUBLICATIONS

International Search Report/Written Opiinion, Aug. 22, 2012.

*Primary Examiner* — Peniel M Gumedzoe
(74) *Attorney, Agent, or Firm* — Ira D. Blecker; Katherine S. Brown

(57) ABSTRACT

Disclosed are a structure including alignment marks and a method of forming alignment marks in three dimensional (3D) structures. The method includes forming apertures in a first surface of a first semiconductor substrate; joining the first surface of the first semiconductor substrate to a first surface of a second semiconductor substrate; thinning the first semiconductor on a second surface of the first semiconductor substrate to provide optical contrast between the apertures and the first semiconductor substrate; and aligning a feature on the second surface of the first semiconductor substrate using the apertures as at least one alignment mark.

19 Claims, 10 Drawing Sheets

(56) References Cited

U.S. PATENT DOCUMENTS

| | | |
|---|---|---|
| 7,474,004 B2 | 1/2009 | Leedy |
| 7,504,732 B2 | 3/2009 | Leedy |
| 7,666,723 B2 | 2/2010 | Frank et al. |
| 7,705,466 B2 | 4/2010 | Leedy |
| 2002/0132465 A1 | 9/2002 | Leedy |
| 2003/0157748 A1 | 8/2003 | Kim et al. |
| 2003/0173608 A1 | 9/2003 | Leedy |
| 2005/0073669 A1* | 4/2005 | Best et al. .................. 355/72 |
| 2007/0216041 A1* | 9/2007 | Patti et al. .................. 257/797 |
| 2009/0067210 A1 | 3/2009 | Leedy |
| 2009/0146325 A1 | 6/2009 | Liu et al. |
| 2009/0174082 A1 | 7/2009 | Leedy |
| 2009/0175104 A1 | 7/2009 | Leedy |
| 2009/0218700 A1 | 9/2009 | Leedy |
| 2009/0219742 A1 | 9/2009 | Leedy |
| 2009/0219743 A1 | 9/2009 | Leedy |
| 2009/0219744 A1 | 9/2009 | Leedy |
| 2009/0219772 A1 | 9/2009 | Leedy |
| 2009/0230501 A1 | 9/2009 | Leedy |
| 2010/0171224 A1 | 7/2010 | Leedy |
| 2010/0171225 A1 | 7/2010 | Leedy |
| 2010/0172197 A1 | 7/2010 | Leedy |
| 2010/0173453 A1 | 7/2010 | Leedy |
| 2010/0200992 A1 | 8/2010 | Purushothaman et al. |
| 2010/0210088 A1 | 8/2010 | Ishimaru et al. |
| 2010/0224876 A1 | 9/2010 | Zhu |
| 2010/0264551 A1 | 10/2010 | Farooq et al. |

FOREIGN PATENT DOCUMENTS

| | | |
|---|---|---|
| CN | 98803836 | 6/2004 |
| EP | 0975472 | 4/1998 |
| EP | 1986233 | 4/1998 |
| JP | 10-543031 | 4/1998 |
| JP | 2008028407 | 8/2007 |
| JP | 2008166831 | 7/2008 |
| JP | 2008166832 | 7/2008 |
| JP | 2008172254 | 7/2008 |
| KR | 10-0639752 | 10/2006 |
| KR | 10-0785821 | 12/2007 |
| TW | 412854 | 11/2000 |

* cited by examiner

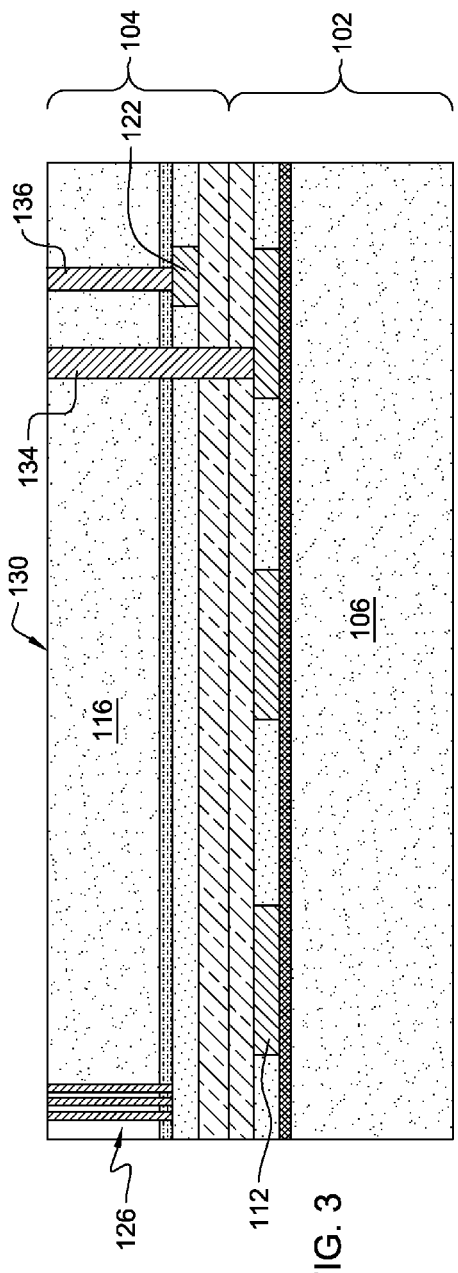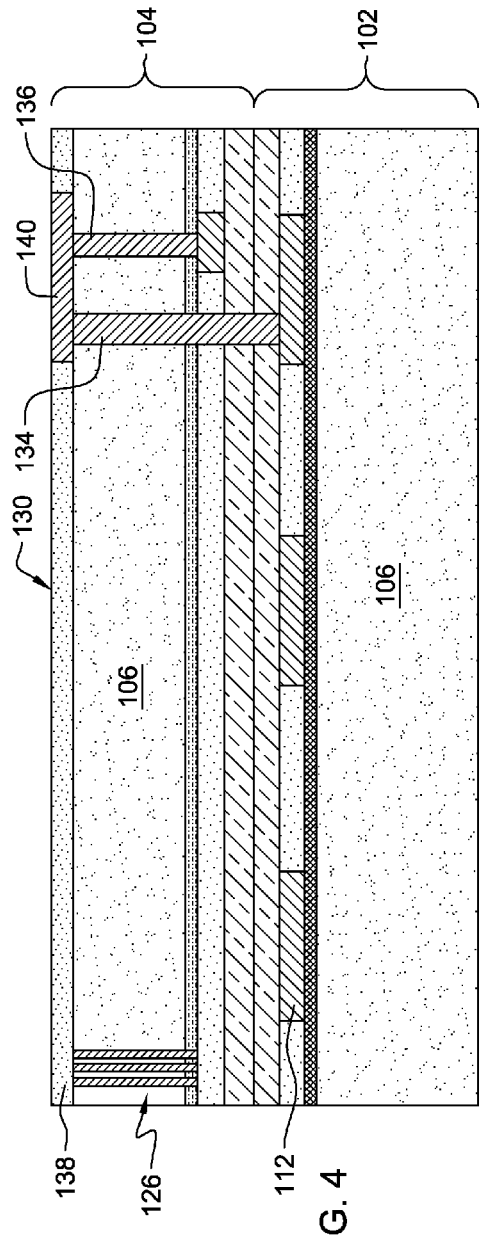

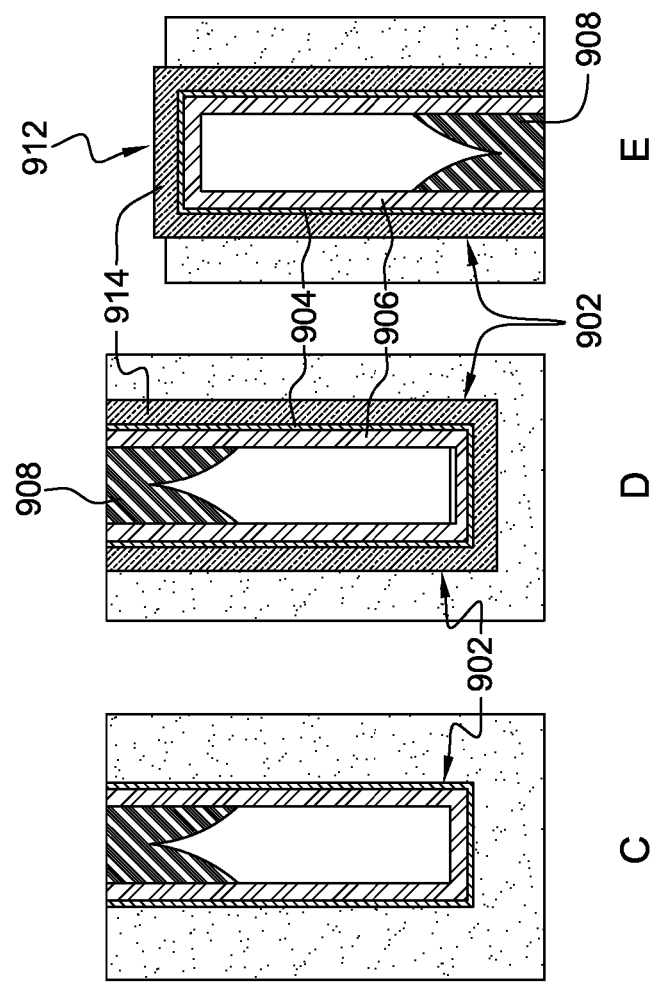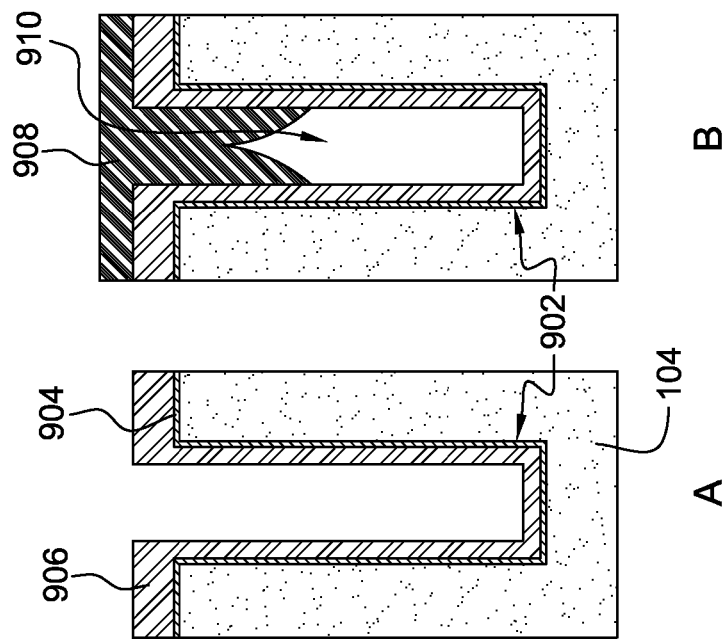
FIG. 9

ALIGNMENT MARKS TO ENABLE 3D INTEGRATION

BACKGROUND

The present invention relates generally to semiconductor device manufacturing techniques and, more particularly, to the use of alignment marks to facilitate the three-dimensional integration of integrated circuit (IC) devices.

The packaging density in the electronics industry continuously increases in order to accommodate more electronic devices into a package. In this regard, three-dimensional (3D) wafer-to-wafer stacking technology substantially contributes to the device integration process. Typically, a semiconductor wafer includes several layers of integrated circuitry (e.g., processors, programmable devices, memory devices, etc.) built on a semiconductor substrate. In order to form a 3D wafer stack, two or more wafer substrates are placed on top of one other and bonded. A top layer of the bonded wafer stack may be connected to a bottom layer of the wafer stack utilizing through silicon interconnects or vias.

3D wafer stacking technology offers a number of potential benefits, including, for example, improved form factors, lower costs, enhanced performance, and greater integration through system-on-chip (SOC) solutions. In addition, the 3D wafer stacking technology may provide other functionality to the chip. For instance, after being formed, the 3D wafer stack may be diced into stacked dies or chips, with each stacked chip having multiple tiers (i.e., layers) of integrated circuitry. SOC architectures formed by 3D wafer stacking can enable high bandwidth connectivity of products such as, for example, logic circuitry and dynamic random access memory (DRAM), that otherwise have incompatible process flows. At present, there are many applications for 3D wafer stacking technology, including high performance processing devices, video and graphics processors, high density and high bandwidth memory chips, and other SOC solutions.

When creating wafer substrates to form a 3D stack, additional processing may be required on the backside plane of the wafer substrate, either prior to or after the completion of the bonding process. Since the backside plane is initially without any features, it effectively is a virgin silicon surface. Alignment of features formed on the unpatterned backside plane to features on the front side of the wafer substrate is critical to functionality of 3D interconnected structures, particularly when utilizing a via-last integration scheme that requires accurate alignment to form interconnections to existing features that are not visible after face-to-face substrate bonding. Present alignment methodologies known in the art used to enable backside first-level alignment require specialized hardware, additional processing, and add micron-scale variability and alignment inaccuracy to the manufacturing process. To enable high-density 3D structures, improved accuracy and cost-effective alignment processes are required.

BRIEF SUMMARY

The various advantages and purposes of the exemplary embodiments as described above and hereafter are achieved by providing, according to a first aspect of the exemplary embodiments, a method of forming alignment marks to enable three dimensional (3D) structures. The method includes forming apertures in a first surface of a first semiconductor substrate; optionally filling the apertures; bonding the first surface of the first semiconductor substrate to a first surface of a second semiconductor substrate; thinning the first semiconductor substrate on a second surface of the first semiconductor substrate to a level to provide optical contrast between the apertures and the first semiconductor substrate; and aligning a feature on the second surface of the first semiconductor substrate using the apertures as at least one reference alignment mark.

According to a second aspect of the exemplary embodiments, there is provided a method of forming alignment marks to enable three dimensional (3D) structures. The method includes obtaining a first semiconductor substrate and a second semiconductor substrate; forming apertures in a first surface of the first semiconductor substrate; optionally filling the paertues; bonding the first surface of the first semiconductor substrate to a first surface of the second semiconductor substrate; thinning the first semiconductor substrate on a second surface of the first semiconductor substrate to a level to provide optical contrast between the apertures and the first semiconductor substrate; and aligning a feature on the second surface of the first semiconductor substrate using the apertures as at least one reference alignment mark.

According to a third aspect of the exemplary embodiments, there is provided a semiconductor structure which includes a semiconductor substrate having an alignment mark on a first surface of the semiconductor substrate that continues through the semiconductor substrate to a second surface of the semiconductor substrate.

According to a fourth aspect of the exemplary embodiments, there is provided a semiconductor structure which includes a first semiconductor substrate having a first and a second surface, the first semiconductor substrate having apertures extending from the first surface to the second surface; a second semiconductor substrate having a first surface, wherein the first surface of the first semiconductor substrate is bonded to the first surface of the second semiconductor substrate; and a feature formed on the second surface of the first semiconductor substrate using the apertures in the second surface as a reference alignment mark for the printed feature. The apertures may optionally be partially or completely filled with a material.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIGS. 1 to 5 illustrate the steps in the three dimensional stacking of semiconductor wafers wherein:

FIG. 1 is a cross sectional view of prepared top and bottom semiconductor substrates prior to bonding;

FIG. 2 is a cross sectional view of the top and bottom semiconductor substrates of FIG. 1 bonded together;

FIG. 3 is a cross sectional view illustrating the thinning of the top semiconductor substrate to expose an exemplary embodiment of the alignment marks;

FIG. 4 is a cross sectional view illustrating the formation of a circuit feature utilizing the alignment marks; and FIG. 5 is a cross sectional view of an additional semiconductor substrate bonded to the top semiconductor substrate utilizing the alignment marks.

FIG. 9 is another exemplary embodiment for forming filled apertures which become the alignment marks.

DETAILED DESCRIPTION

Alignment marks are critical to the manufacturing of 3D semiconductor substrates. Alignment marks are needed on the front side of the semiconductor substrates to align the semiconductor substrates prior to bonding into a 3D stack. Alignment marks are also needed on the backside of the semiconductor substrates to add features to the back side of the semiconductor substrate, to add through silicon vias after the semiconductor substrates are bonded and to join additional semiconductor substrates to the 3D stack. Transferring alignment marks from the front side of the semiconductor substrate to the back side is possible using current methodologies known in the art, but the transfer of alignment marks needs to be done prior to substrate bonding, requires specialized tooling and several additional costly process steps, and result in decreased alignment accuracy compared to conventional UV photolithography methods known in the art.

The present invention proposes alignment marks and a process for forming the alignment marks which is less complicated and more accurate than methods currently practiced in the art. FIGS. 1 to 5 illustrate a process for forming alignment marks which are created on the front side of the semiconductor substrate but are functional to enable alignment with respect to the back side of the semiconductor substrate.

Figure 1:
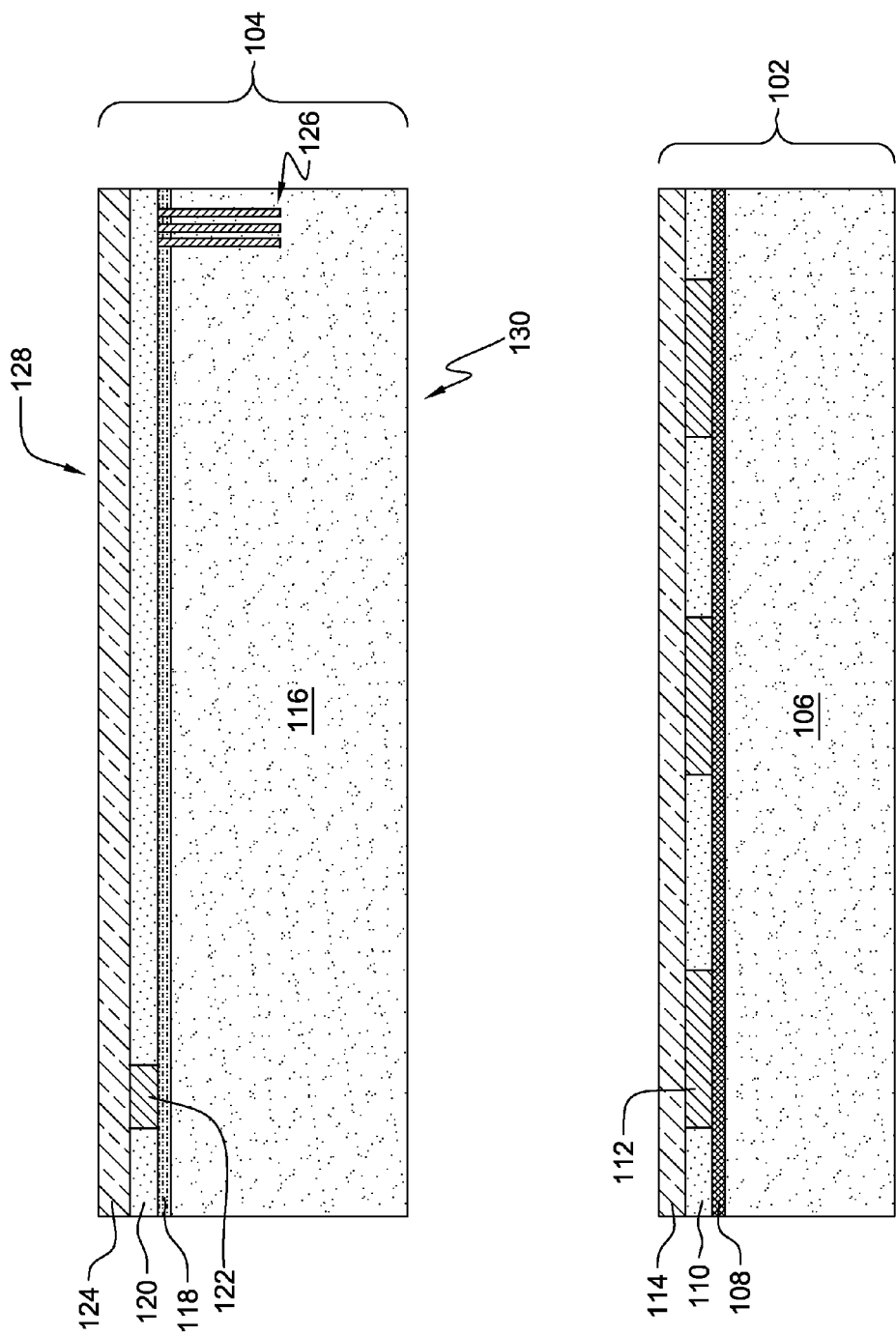

Referring now to FIG. 1, there is illustrated a bottom semiconductor substrate 102 and a top semiconductor substrate 104. While bottom semiconductor substrate 102 and top semiconductor substrate 104 will be described with respect to certain features on the semiconductor substrates 102, 104, it should be understood that the present invention is useful for the stacking and bonding of any type of semiconductor substrate having any kind of features. In an exemplary embodiment, bottom semiconductor substrate 102 has a semiconductor base substrate 106 which may be made from any semiconductor material. The semiconductor base substrate 106 may include any type of semiconductor device as well as wiring and contact levels required to create functional integrated circuits. For clarity, any such semiconductor devices and associated wiring are omitted. On top of semiconductor base substrate 106 may be a dielectric layer 108 followed by another dielectric layer 110. Dielectric layers 108 and 110 may be oxide or any other dielectric material known in the art including but not limited to nitride, oxynitride and organic dielectrics.

Within dielectric layer 110 are landing pad structures 112 composed of a conductive material, which may connect to the semiconductor devices within semiconductor base substrate 106. In a preferred embodiment, dielectric layer 108, landing pad structure 112 and other wiring layers not shown are located in the back end of the line (BEOL) wiring layers which may include, for example, active and passive elements or devices. In other embodiments, dielectric layer 108 and landing pad structure 112 may be incorporated in other levels of the semiconductor device, such as a contact level. Landing pad structure 112 may be a standard existing wire structure rather than an independent feature incorporated in a wiring layer. One purpose of landing pads 112 may be to connect with through silicon vias in a subsequent process. The landing pads 112 may be composed of a metal, for example copper, aluminum, tungsten, or gold, and may contact wiring levels above and below the landing pads 112. Lastly, bottom semiconductor substrate 102 may include a bonding layer 114 for bonding semiconductor substrate 102 with semiconductor substrate 104. Bonding layer 114 may include, for example, an activated oxide layer. Other types of materials for bonding layer 114 may be possible, and the scope of the present invention is not limited to any specific substrate bonding methodology or bonding material.

In an exemplary embodiment, top semiconductor substrate 104 has a semiconductor base substrate 116 which may be made from any semiconductor material. The semiconductor base substrate 116 may include any type of semiconductor device as well as wiring and contact levels required to create functional integrated circuits. For clarity, any such semiconductor devices and associated wiring are omitted. In addition, semiconductor substrate 116 may be a different type of semiconductor substrate than semiconductor substrate 106 and also may contain different kinds of semiconductor devices. On top of semiconductor base substrate 116 may be a dielectric layer 118 followed by another dielectric layer 120. Dielectric layers 118 and 120 may be oxide or any other dielectric material known in the art including but not limited to nitride, oxynitride and organic dielectrics.

Within dielectric layer 120 may be landing pad structure 122 composed of a conductive material, which may connect to the semiconductor devices within semiconductor base substrate 116. In a preferred embodiment, dielectric layer 118, dielectric layer 120, landing pad structure 122 and other wiring layers not shown are located in the back end of the line (BEOL) wiring layers which may include, for example, active and passive elements or devices. In other embodiments, dielectric layers 118, 120, and landing pad structure 122 may be incorporated in other levels of the semiconductor device, such as a contact level. Landing pad structure 122 may be a standard existing wire structure rather than an independent feature incorporated in a wiring layer. One purpose of landing pads 122 may be to connect with through silicon vias in a subsequent process. The landing pads 122 may be composed of a metal, for example, copper, aluminum, tungsten, or gold, and may contact wiring levels above and below the landing pads 122. Top semiconductor substrate 104 may include a bonding layer 124 as explained above for bonding semiconductor substrate 104 with semiconductor substrate 102.

Additional alignment marks can be included in respective bonding layers 114 and 124 or other locations within the structures of substrates 102 and 104 to enable visual alignment of exposed surfaces during bonding as required. Any such alignment marks have been omitted from the Figures since such alignment marks are not relevant to the scope of the present invention, In addition, top semiconductor substrate 104 includes filled apertures 126 which may perform the function of reference alignment marks as will be explained hereafter. The filled apertures 126 may be partially filled or entirely filled. The filled apertures 126 are blind vias or blind trenches which extend only partly into semiconductor base substrate 116. The materials for the filled apertures 126 are chosen so as to provide good optical contrast between the filled apertures 126 and the surrounding semiconductor substrate 104. The filled apertures 126 may be accurately placed and formed with respect to a front surface 128 of the semiconductor substrate 104 using standard semiconductor patterning methodologies known in the art. The depth, size, and geometry of filled apertures 126 is dependent on the manufacturing processes and integration selected, and are not limited by the scope of the present invention.

In a subsequent process, top semiconductor substrate 104 will be thinned to enable good optical contrast between semiconductor substrate 104 and the filled apertures 126 on a back surface 130 of the semiconductor substrate 104. The front surface 128 is opposite the back surface 130. Thus, once exposed to a thickness of the top semiconductor substrate 104 after thinning that enables sufficient optical contrast, the filled apertures 126 may be used as reference alignment marks for features printed or added to the back surface 130 of the semiconductor substrate 104 using standard photolithography and patterning methodologies known in the art to enable first-level patterning on the unpatterned surface 130 with a high degree of accuracy with respect to features within substrate 104 that are not visible after bonding of substrates 102 and 104. The accurate placement of the filled apertures 126 with respect to the front surface 128 of the semiconductor substrate 104 will result in equally accurate placement of the filled apertures with respect to the back surface 130 of the semiconductor substrate 104.

The process for forming the filled apertures 126 will be discussed subsequently with respect to FIGS. 7 to 10.

Figure 2:
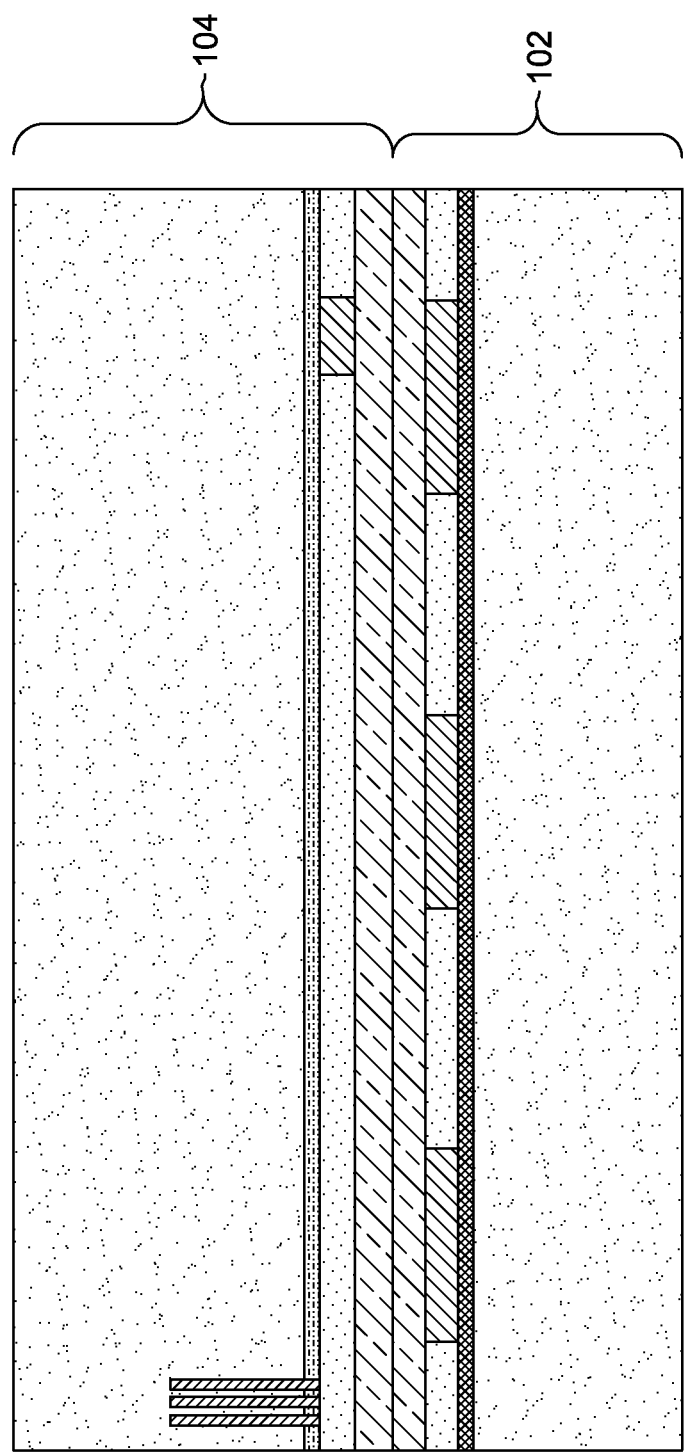

Referring now to FIG. 2, top semiconductor substrate 104 has been flipped over and bonded to bottom semiconductor substrate 102. The bonding methodology utilized may be, for example, oxide-to-oxide bonding such as by annealing. Other forms of bonding, such as adhesive bonding or metal-metal bonding may also be practiced. The scope of the present invention is not limited to any specific substrate bonding methodology or bonding material.

Referring now to FIG. 3, top semiconductor substrate 104 is then thinned by a conventional process. An exemplary process for thinning top semiconductor substrate 104 may include grinding followed by a dry etch, such as reactive ion etching. Sufficient material must be removed from surface 130 of substrate 104 to enable optical contrast between the filled apertures 126 and substrate 104. The thickness of substrate 104 required to be removed during thinning is dependent on the depth of filled apertures 126, the material used to fill filled apertures 126, and the capability of photolithography equipment to be used for additional first-level alignment on back surface 130, and the thickness of material removed or remaining is not limited by the scope of this invention. As a result of thinning top semiconductor substrate 104, filled apertures 126 may then be exposed on the back surface 130 of the top semiconductor substrate 104. The filled apertures 126 may be flush with the back side surface 130, may even extend above back surface 130, or may remain concealed under a thin layer of substrate 104 in the range of 200 to 5000 angstroms if sufficient optical contrast can be attained to enable the reference alignment marks to be functional.

Referring now to FIGS. 6A to 6D, several different exemplary embodiments of the filled apertures 126 are shown. The filled apertures 126A to 126D shown in FIGS. 6A to 6D are shown as they would appear on the back surface 130 of the top semiconductor substrate 104. In FIG. 6A, the filled apertures 126A may be in the form of a box in a box. In FIG. 6B, the filled apertures 126B may be in the form of a circle in a circle. In FIG. 6C, the filled apertures 126C may be in the form of lines in lines while in FIG. 6D, the filled apertures 126D may be in the form of "L" brackets. Other exemplary embodiments of the filled apertures 126 are within the scope of the present invention. Vias or trenches may be used to form the filled apertures 126A to 126D. Dimensions of the filled apertures vary depending on the depth required of the reference alignment mark, and the dimensions of the claimed structures are not limited by the scope of the present invention.

The filled apertures 126A to 126D may be used as alignment marks in and of themselves. In an exemplary embodiment, an alignment feature may be printed or formed on the back surface 130 of the top semiconductor substrate 104 using the filled apertures 126 as reference points. Thus, FIG. 6A has a printed box alignment feature 132A, FIG. 6B has a printed circle alignment feature 132B, FIG. 6C has a printed line alignment feature 132C and FIG. 6D has a printed cross alignment feature.

Again, the filled apertures 126A to 126D are very accurately located so that the printed alignment features 132A to 132D will also be very accurately located.

Figure 6:
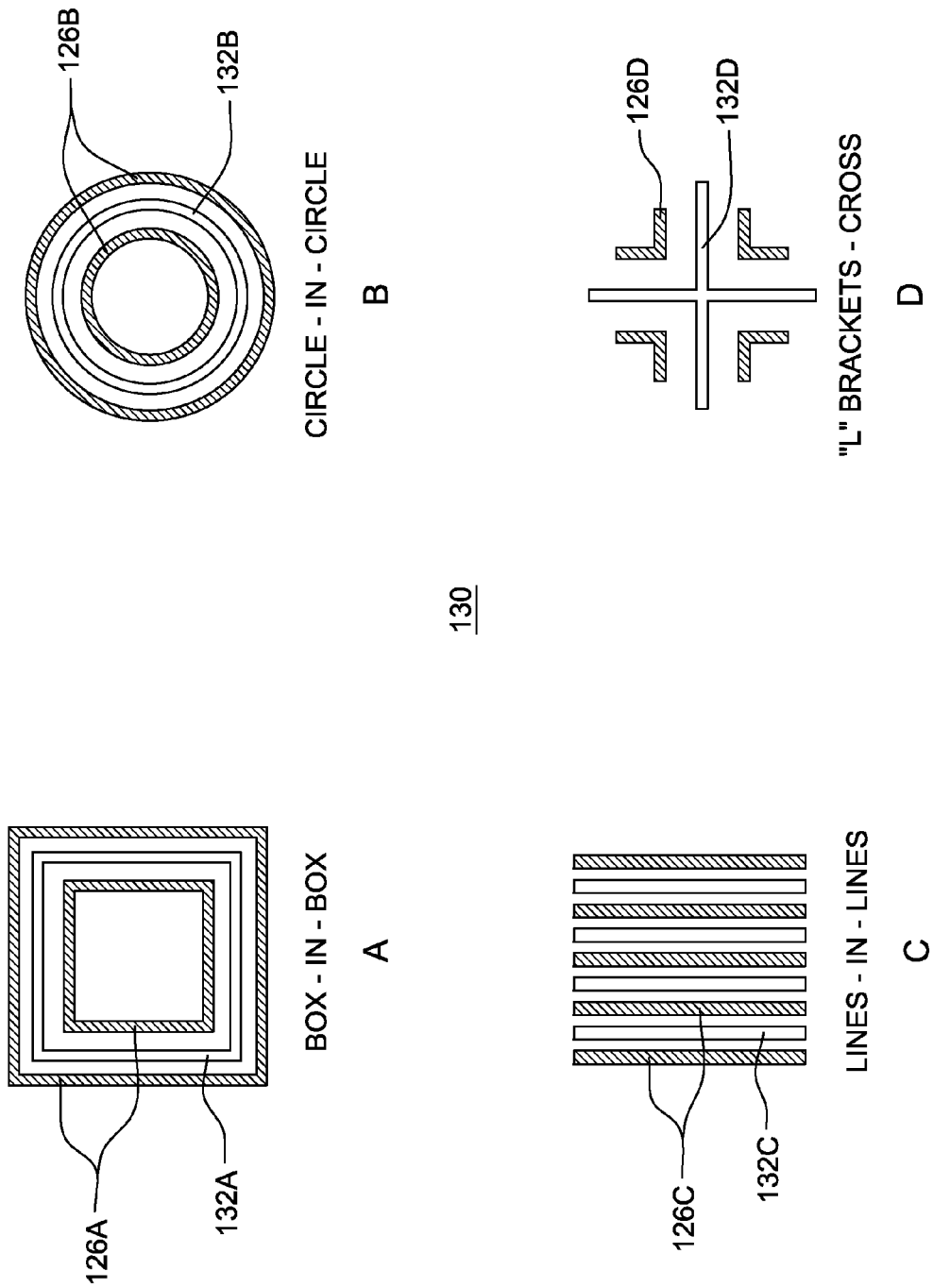
FIG. 6 are planar views of the alignment marks and a printed alignment feature.

Returning to FIG. 3, the filled apertures 126 or printed alignment feature 132 shown in FIG. 6 may be used to accurately place and create additional circuit features such as through silicon via 134 and through silicon via 136 (assuming that semiconductor base substrate 116 comprises silicon). There may be other circuit features not shown. Through silicon via 134 extends from the back surface 130 of the top semiconductor substrate 104 to landing pad 112 on bottom semiconductor substrate 102 while through silicon via 136 extends from the back surface 130 of the top semiconductor substrate 104 to landing pad 122 on the top semiconductor substrate 104. Through silicon vias 134, 136 may be conventionally formed by etching through the semiconductor base substrate 116 and any intermediate dielectric layers to form apertures and then filling the apertures with an optional liner and a conductive material according to processes known in the art. Through silicon vias 134, 136 are shown as being filled with a conductive material. The exemplary embodiments may have applicability to other semiconductor materials in which there will be through vias equivalent to the through silicon vias. Other through silicon via interconnect structures that directly connect substrates 102 and 104 in a single via formation step may also be utilized. The through silicon via integration, methodologies for formation, and materials are not limited by the scope of the present invention.

Referring now to FIG. 4, in one exemplary embodiment, at least one additional layer of dielectric material 138 may be deposited on the back surface 130 of top semiconductor surface 104, patterned and then a conductive pad or wiring layer 140 conventionally formed to connect through silicon vias 134, 136. Reference alignment marks 126 may still be functional after additional dielectric layer formation. Further layers and bonding pads may be added to complete the fabrication of the 3D stack of semiconductor substrates followed by dicing to form 3D stacks of individual semiconductor chips.

Figure 5:
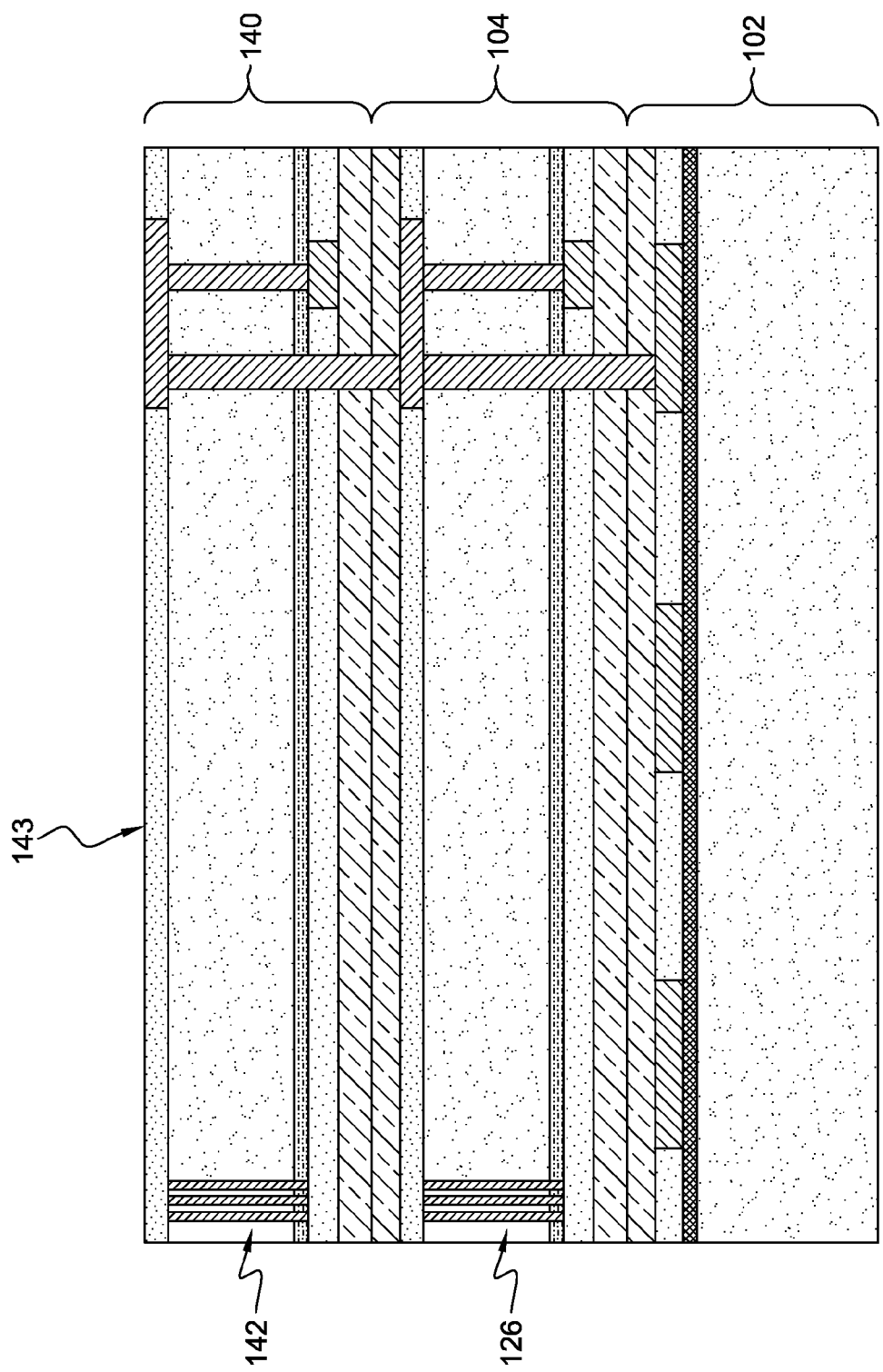

The filled apertures 126 and/or printed features 132 (shown in FIG. 6) in top semiconductor substrate 104 may be used to align with another semiconductor substrate 140 to continue with 3D stacking as shown in FIG. 5. Semiconductor substrate 140 may also have filled apertures 142 for printing of features on or adding circuit features to the back surface 143 of semiconductor substrate 140. In addition, filled apertures 142 may also be advantageous in adding yet another semiconductor substrate (not shown) to the 3D stack of semiconductor substrates.

Figure 7:
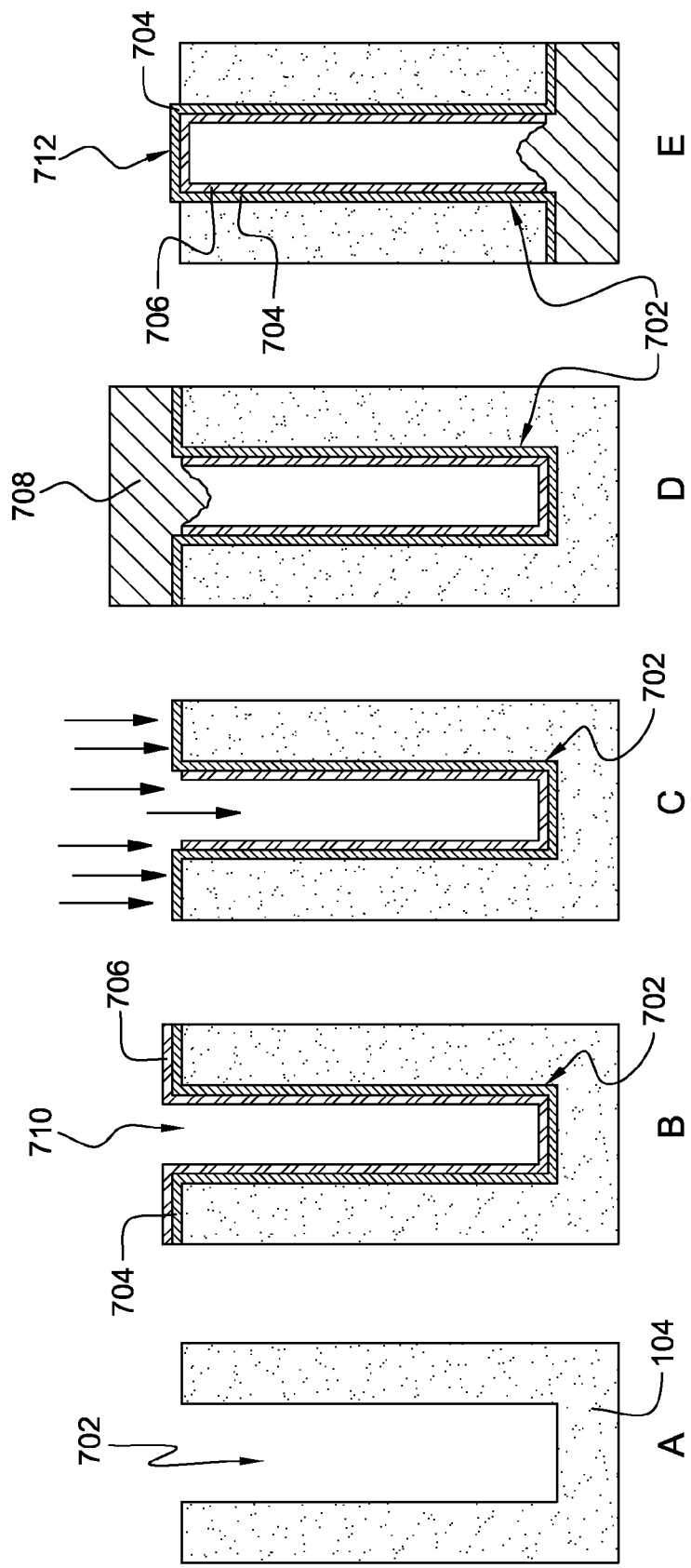
FIG. 7 is an exemplary embodiment for forming filled apertures which become the alignment marks.
Figure 8:
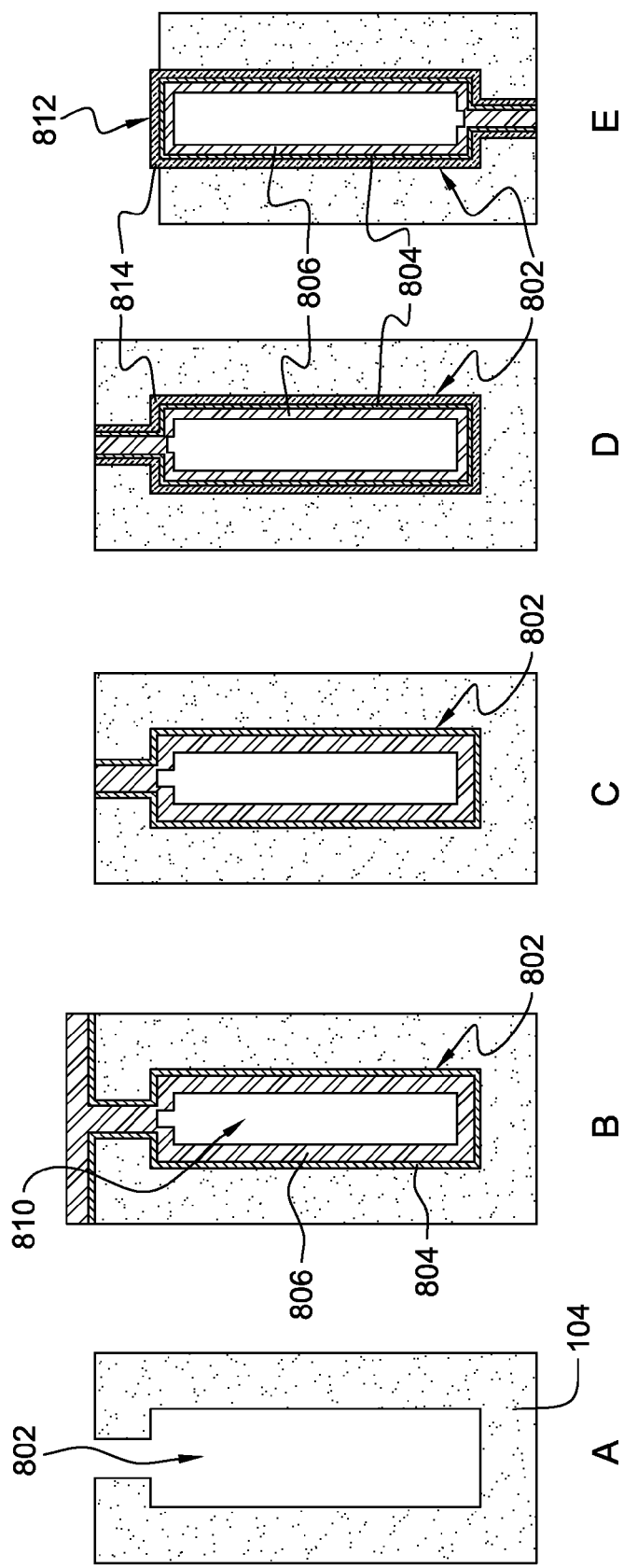
FIG. 8 is another exemplary embodiment for forming filled apertures which become the alignment marks.
Figure 10:
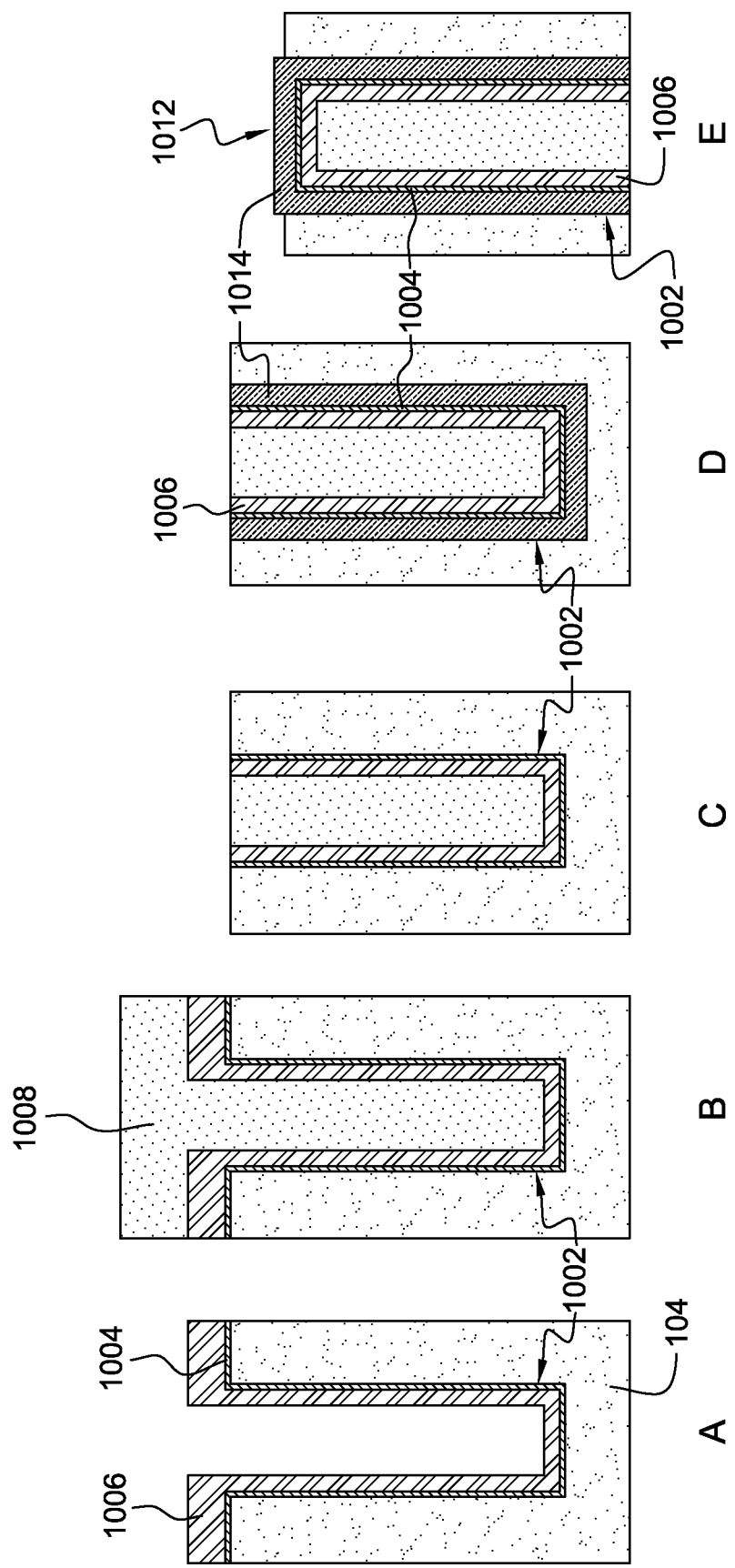
FIG. 10 is another exemplary embodiment for forming filled apertures which become the alignment marks.
Figure 11:
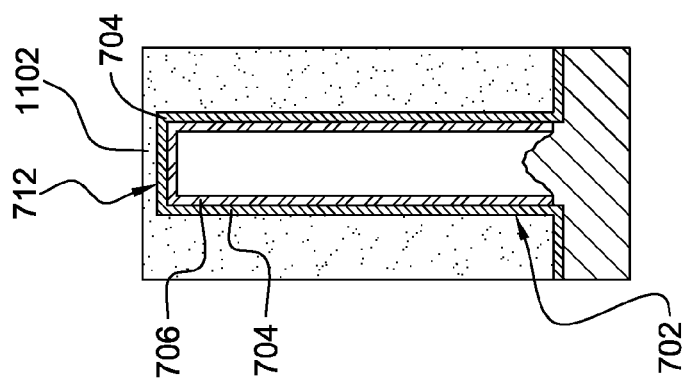
FIG. 11 is another exemplary embodiment for forming filled apertures which become the alignment marks.

Referring now to FIGS. 7 to 11, several different exemplary embodiments are shown for forming the filled apertures 126. Referring first to FIG. 7, in FIG. 7A apertures 702 (vias or trenches) are conventionally etched in top semiconductor substrate 104 followed, in FIG. 7B, by depositing an optional liner 704, for example of chemical vapor deposited (CVD) titanium nitride, followed by a thin conformal layer 706 of a material that is known to provide sufficient optical contrast with the substrate material to enable use of traditional photolithography methodologies. Layer 706 may consist of conductive material, such as tungsten as a preferred embodiment which provides excellent optical contrast with the substrate material, for example. The aperture 702 is now partially filled. The layer 706 should not entirely fill the filled aperture 702 but leave a hollow space 710. The thin conformal layer 706 may be, for example, 500 to 1000 angstroms thick. Any overburden of layer 706 is removed using processes known in the art, such as by an anisotropic etch as shown in FIG. 7C or by chemical mechanical polishing (CMP). Next, a dielectric layer 708 (such as dielectric layer 120 in FIG. 1) is deposited over the top semiconductor substrate 104 to pinch off the aperture 702. The top semiconductor substrate 104 is then flipped over, bonded to semiconductor substrate 102 and then thinned as described previously. As a result of the thinning, the bottom 712 of filled aperture 702 now has sufficient optical contrast from substrate 104 to be visible to photolithography equipment as described previously. As shown in FIG. 7E, the bottom 712 of filled aperture 702 extends above the top semiconductor substrate 104 but bottom 712 of filled aperture 702 may also be flush with top semiconductor substrate 104, or remain covered by a thin layer of substrate 104 in the range of 200 to 5000 angstroms. FIG. 11 is an example of where a thin layer 1102 of semiconductor substrate 104 covers the bottom 712 of filled aperture 702. The thin layer 1102 (in the range of 200 to 5000 angstroms) is thin enough so that there is optical contrast between the filled aperture 702 and semiconductor substrate 104. During the thinning process, the liner layer 704 may be removed to expose the conformal layer 706.

Another exemplary embodiment of a filled aperture is shown in FIGS. 8A to 8E. In FIG. 8A, a bottle shaped trench is conventionally formed in top semiconductor substrate 104. Thereafter, as shown in FIG. 8B, an optional liner 804, for example CVD titanium nitride, is deposited followed by a conformal layer 806 of a material that is known to provide sufficient optical contrast with the substrate material to enable use of traditional photolithography methodologies. Layer 806 may consist of conductive material, such as CVD tungsten as a preferred embodiment which provides excellent optical contrast with the substrate material, for example. Layer 806 pinches off the top of the bottle. The aperture 802 is now partially filled. The conformal layer 806 should not entirely fill the filled aperture 802 but leave a hollow space 810. Any overburden of the conformal layer 806 may be removed by a chemical mechanical polishing (CMP) process to result in the structure shown in FIG. 8C. In an optional exemplary embodiment shown in FIG. 8D, there may be a conformal dielectric layer 814 deposited prior to deposition of the conformal titanium nitride liner 804 and the conformal layer 806. The top semiconductor substrate 104 is then flipped over, bonded to the bottom semiconductor substrate 102 and then thinned as described previously. As a result of the thinning, the bottom 812 of filled aperture 802 has sufficient optical contrast from substrate 104 to be visible to photolithography equipment as described previously. As shown in FIG. 8E, the bottom 812 of filled aperture 802 extends above the top semiconductor substrate 104 but bottom 812 of filled aperture 802 may also be flush with top semiconductor substrate 104 or remain covered by a thin layer of semiconductor substrate 104 as shown, for example, in FIG. 11. During the thinning process, the liner layer 804 or conformal dielectric layer 814 may be removed to expose the conformal layer 806.

Referring now to FIGS. 9A to 9E, an aperture 902 (via or trench) is etched in top semiconductor substrate 104 followed by deposition of an optional liner 904, for example CVD titanium nitride, followed by deposition of a conformal layer 906 of a material that is known to provide sufficient optical contrast with the substrate material to enable use of traditional photolithography methodologies as shown in FIG. 9A. Layer 906 may consist of conductive material, such as CVD tungsten as a preferred embodiment which provides excellent optical contrast with the substrate material, for example. In FIG. 9B, a second low-stress nonconformal layer 908 of, for example, tungsten is deposited to pinch off the aperture 902 prior to entirely filling it. Nonconformal deposition of tungsten may be obtained by processing in a diffusion-controlled CVD regime. The aperture 902 is now partially filled. The conformal layers 906, 908 should not entirely fill the filled aperture 902 but leave a hollow space 910. Any overburden of the conformal layers 906, 908 may be removed by a CMP process to result in the structure shown in FIG. 9C. In an optional exemplary embodiment shown in FIG. 9D, there may be a conformal dielectric layer 914 deposited prior to deposition of the conformal titanium nitride liner 904 and conformal layer 906. The top semiconductor substrate 104 is then flipped over, bonded to the bottom semiconductor substrate 102 and then thinned as described previously. As a result of the thinning, the bottom 912 of filled aperture 902 has sufficient optical contrast from substrate 104 to be visible to photolithography equipment as described previously. As shown in FIG. 9E, the bottom 912 of filled aperture 902 extends above the top semiconductor substrate 104 but bottom 912 of filled aperture 902 may also be flush with top semiconductor substrate 104 or remain covered by a thin layer of semiconductor substrate 104 as shown, for example, in FIG. 11. During the thinning process, the liner layer 904 or conformal dielectric layer 914 may be removed to expose the conformal layer 906.

Next exemplary embodiments are shown in FIGS. 10A to 10E. Referring first to FIG. 10A, an aperture 1002 (via or trench) is etched in top semiconductor substrate 104 followed by deposition of an optional liner 1004, for example CVD titanium nitride, followed by deposition of a conformal layer 1006 of a material that is known to provide sufficient optical contrast with the substrate material to enable use of traditional photolithography methodologies. Layer 1006 may consist of conductive material, such as CVD tungsten as a preferred embodiment which provides excellent optical contrast with the substrate material, for example. In FIG. 10B, aperture 1002 is completely filled with a dielectric such as an oxide or nitride 1008. The aperture 1002 is now completely filled. Any overburden of the conformal layer 1006 and dielectric 1008 may be removed by a CMP process to result in the structure shown in FIG. 10C. In an optional exemplary embodiment shown in FIG. 10D, there may be a conformal dielectric layer 1014 deposited prior to deposition of the conformal titanium nitride liner 1004 and conformal layer 1006. The top semiconductor substrate 104 is then flipped over, bonded to the bottom semiconductor substrate 102 and then thinned as described previously. As a result of the thinning, the bottom 1012 of filled aperture 1002 has sufficient optical contrast from semiconductor substrate 104 to be visible to photolithography equipment as described previously. As shown in FIG. 10E, the bottom 1012 of filled aperture 1002 extends above the top semiconductor substrate 104 but bottom 1012 of filled aperture 1002 may also be flush with top semiconductor substrate 104 or remain covered by a thin layer of semiconductor substrate 104 as shown, for example, in FIG. 11. During the thinning process, the liner layer 1004 or conformal dielectric layer 1014 may be removed to expose the conformal layer 1006.

In the above embodiments, the optional liner layer was stated to be titanium nitride. In other exemplary embodiments, the optional liner layer may also be a combination of tantalum and tantalum nitride. In addition to the optional liner, the conformal dielectric layer may be used to increase the fracture strength of the semiconductor material of semiconductor base 116.

Tungsten is the preferred material for the filled apertures because tungsten provides excellent contrast for backside imaging and alignment. In this regard, the optional liner layer or conformal dielectric (if present) is preferably removed during the thinning of top semiconductor substrate 104 to expose the tungsten in the filled apertures. A problem in using tungsten for the filled apertures is that it is a high stress material which may result in significant substrate bow making subsequent substrate processing difficult. Accordingly, when tungsten is utilized in the filled apertures, the filled apertures are only partially filled which provides the advantage of high contrast without causing substrate bow.

In addition to tungsten, other materials to partially or entirely fill the filled apertures include but are not limited to polycrystalline silicon, oxide, oxide/nitride, silicides, copper, tantalum/tantalum nitride, ruthenium and titanium/titanium nitride.

Figure 12:
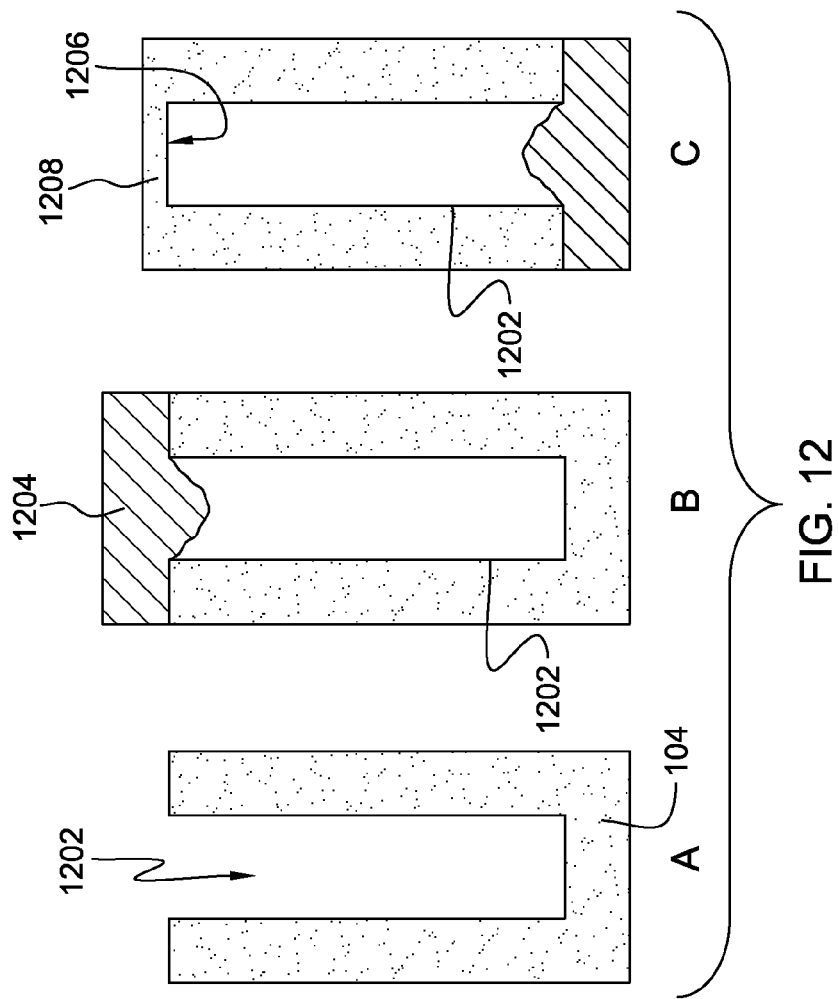
FIG. 12 is another exemplary embodiment for forming unfilled apertures which become the alignment marks.

A last exemplary embodiment is illustrated in FIGS. 12A to 12C wherein the apertures are not filled. Referring first to FIG. 12A apertures 1202 (vias or trenches) are conventionally etched in top semiconductor substrate 104. In this embodiment, the aperture 1202 remains unfilled. Next, a dielectric layer 1204 (such as dielectric layer 120 in FIG. 1) is deposited over the top semiconductor substrate 104 to pinch off the aperture 1202 as shown in FIG. 12B. The top semiconductor substrate 104 is then flipped over, bonded to semiconductor substrate 102 and then thinned as described previously. As a result of the thinning, the bottom 1206 of unfilled aperture 1202 now has sufficient optical contrast from substrate 104 to be visible to photolithography equipment as described previously. As shown in FIG. 12C, the bottom 1206 of unfilled aperture 1202 is covered by a thin layer 1208 of substrate 104. The thin layer 1208 should have a thickness in the range of 200 to 5000 angstroms.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A method of forming alignment marks to enable three dimensional (3D) structures comprising:
   forming apertures in a first surface of a first semiconductor substrate;
   bonding the first surface of the first semiconductor substrate to a first surface of a second semiconductor substrate;
   thinning the first semiconductor substrate on a second surface of the first semiconductor substrate to provide optical contrast between the apertures and the first semiconductor substrate;
   forming a second alignment mark on the second surface of the first semiconductor substrate using at least one of the apertures as a first alignment mark such that the second alignment mark is within, and mimics, the first alignment mark; and
   aligning a feature on the second surface of the first semiconductor substrate using the second alignment mark.

2. A method of forming alignment marks to enable three dimensional (3D) structures comprising:
   obtaining a first semiconductor substrate and a second semiconductor substrate;
   forming apertures in a first surface of the first semiconductor substrate;
   bonding the first surface of the first semiconductor substrate to a first surface of the second semiconductor substrate;
   thinning the first semiconductor substrate on a second surface of the first semiconductor substrate to provide optical contrast between the apertures and the first semiconductor substrate, wherein the apertures having a first closed end adjacent to the first surface of the first semiconductor substrate and a second closed end adjacent to the second surface of the first semiconductor substrate and the apertures having a central hollow space in each of the apertures; and
   aligning a feature on the second surface of the first semiconductor substrate using the apertures as at least one alignment mark.

3. The method of claim 2 further comprising forming an alignment mark on the second surface of the first semiconductor substrate using the apertures as at least one alignment mark.

4. The method of claim 2 wherein the apertures are at least partially filled and thinning the first semiconductor substrate exposes the filled apertures.

5. The method of claim 2 further comprising thinning the first semiconductor substrate to leave a thin layer of the first semiconductor substrate over the apertures to optically expose the apertures, wherein the apertures are at least partially filled.

6. The method of claim 2 wherein forming the apertures comprises forming the apertures only part way through the first semiconductor substrate.

7. The method of claim 2 wherein the feature is a via extending from the second surface of the first semiconductor substrate into the first semiconductor substrate.

8. The method of claim 2 further comprising joining a third semiconductor substrate to the second surface of the first semiconductor substrate using the filled apertures as alignment marks to align the third semiconductor substrate with the second surface of the first semiconductor substrate.

9. A method of forming alignment marks to enable three dimensional (3D) structures comprising:
   obtaining a first semiconductor substrate and a second semiconductor substrate;
   forming apertures in a first surface of the first semiconductor substrate;
   filling the apertures wherein filling the apertures comprises:
      depositing a liner of a first material in the apertures; and
      depositing a conformal layer of a second material over the liner, wherein the
      conformal layer does not fill the apertures so as to have a central hollow space in each of the apertures;
   bonding the first surface of the first semiconductor substrate to a first surface of the second semiconductor substrate;

thinning the first semiconductor substrate on a second surface of the first semiconductor substrate to provide optical contrast between the apertures and the first semiconductor substrate; and aligning a feature on the second surface of the first semiconductor substrate using the apertures as at least one alignment mark, the apertures used for aligning having a central hollow space in each of the apertures.

10. The method of claim 9 wherein the first material is titanium nitride or a combination of tantalum and tantalum nitride and wherein the thinning of the first semiconductor on a second surface includes removing the liner from the apertures and leaving the conformal layer exposed.

11. The method of claim 9 wherein the first material is titanium nitride or a combination of tantalum and tantalum nitride and the second material is selected from the group consisting of tungsten, polycrystalline silicon, oxide, oxide/nitride, silicides, copper, tantalum/tantalum nitride, ruthenium and titanium/titanium nitride.

12. The method of claim 9 further comprising depositing a dielectric over the apertures which closes off the apertures but does not fill the apertures.

13. The method of claim 9 wherein the apertures are bottle shaped having a reduced opening at an open end of the apertures and wherein the depositing of the conformal layer closes off the apertures.

14. The method of claim 9 further comprising depositing a nonconformal layer of the second material over the apertures to close off the apertures.

15. A method of forming alignment marks to enable three dimensional (3D) structures comprising:

obtaining a first semiconductor substrate and a second semiconductor substrate;

forming apertures in a first surface of the first semiconductor substrate;

filling the apertures comprising depositing a liner of a first material in the apertures, and depositing a conformal layer of a second material over the liner, wherein the conformal layer does not fill the apertures;

bonding the first surface of the first semiconductor substrate to a first surface of the second semiconductor substrate;

thinning the first semiconductor on a second surface of the first semiconductor substrate to provide optical contrast between the apertures and the first semiconductor substrate;

aligning a feature on the second surface of the first semiconductor substrate using the apertures as at least one alignment mark; and further comprising, after depositing a conformal layer, depositing a third material to completely fill the apertures, wherein the third material is a dielectric material.

16. A semiconductor structure comprising a semiconductor substrate having an alignment mark that provides optical contrast on a first surface of the semiconductor substrate that continues through the semiconductor substrate to provide optical contrast on a second surface of the semiconductor substrate wherein the alignment mark comprises an aperture and wherein the aperture having a first closed end adjacent to the first surface of the first semiconductor substrate and a second closed end adjacent to the second surface of the first semiconductor substrate, the aperture having a central hollow space in the aperture.

17. The semiconductor structure of claim 16 wherein the aperture is unfilled.

18. The semiconductor structure of claim 16 wherein the aperture is partly filled.

19. A semiconductor structure comprising:

a first semiconductor substrate having a first and a second surface, the first semiconductor substrate having filled apertures extending from the first surface to the second surface, the apertures comprising a liner of a first material, a conformal layer of a second material over the liner and a third material over the conformal layer to completely fill the apertures, wherein the third material is a dielectric material;

a second semiconductor substrate having a first surface, wherein the first surface of the first semiconductor substrate is bonded to the first surface of the second semiconductor substrate; and a feature formed on the second surface of the first semiconductor substrate using the apertures in the second surface as an alignment mark for the formed feature.

* * * * *